US009400305B2

(12) United States Patent
Bettio et al.

(10) Patent No.: US 9,400,305 B2
(45) Date of Patent: Jul. 26, 2016

(54) INSTRUMENT AND METHOD FOR DETECTING PARTIAL ELECTRIC DISCHARGES IN AN ELECTRIC APPARATUS

(75) Inventors: Fabiano Bettio, Monte San Pietro (IT); Gian Carlo Montanari, Zola Predosa (IT)

(73) Assignee: TECHIMP HQ S.R.L., Zola Predosa (IT)

( * ) Notice: Subject to any disclaimer, the term of this patent is extended or adjusted under 35 U.S.C. 154(b) by 1125 days.

(21) Appl. No.: 13/321,452

(22) PCT Filed: May 28, 2010

(86) PCT No.: PCT/IB2010/052386
§ 371 (c)(1),
(2), (4) Date: Nov. 18, 2011

(87) PCT Pub. No.: WO2010/136999
PCT Pub. Date: Dec. 2, 2010

(65) Prior Publication Data
US 2012/0095710 A1    Apr. 19, 2012

(30) Foreign Application Priority Data
May 29, 2009   (IT) .............................. BO2009A0352

(51) Int. Cl.
*G06F 19/00*    (2011.01)
*G01R 31/12*    (2006.01)

(52) U.S. Cl.
CPC .................................. *G01R 31/1227* (2013.01)

(58) Field of Classification Search
CPC .... G01R 27/2605; G01R 31/40; G01R 31/12; G01R 31/021; G01R 31/1272; G01R 31/083; G01R 31/024; G01R 31/025; G01R 31/1254; G01R 31/1227
See application file for complete search history.

(56) References Cited

U.S. PATENT DOCUMENTS 3,882,380 A * 5/1975 Black ................. G01R 27/2605
                                                     324/547
5,323,117 A * 6/1994 Endoh .................. G01R 31/021
                                                     324/541
(Continued)

FOREIGN PATENT DOCUMENTS

EP           1 094 323 A2     4/2001
KR     10-2009-0002588 A      1/2009
(Continued)

OTHER PUBLICATIONS

IEEE Xplore Search Results_Extracted Feb. 6, 2015, PDF file attached.*
(Continued)

*Primary Examiner* — Jermele M Hollington
*Assistant Examiner* — Suresh K Rajaputra
(74) *Attorney, Agent, or Firm* — Pearne & Gordon LLP (57) ABSTRACT

An instrument for detecting partial electric discharges includes: an input stage set up to receive a discharge signal representative of one or more partial discharge pulses and a sync signal representative of an alternating voltage applied to the electric apparatus; a data processing stage for receiving the discharge signal and the sync signal, and extracting substantially in real time for each pulse detected the value of an amplitude parameter, correlated with a pulse amplitude, and the value of a phase parameter, representative of the phase of the voltage applied to the electric apparatus concurrently with the pulse, and transferring to output a processed digital signal including the values extracted. The processing stage includes a filtering module set up to disable substantially in real time the transfer to output of the values of the parameters extracted for one or more pulses.

10 Claims, 3 Drawing Sheets

(56) References Cited

U.S. PATENT DOCUMENTS

| | | | | |
|---|---|---|---|---|
| 6,445,189 | B1* | 9/2002 | Pakonen | G01R 31/025 324/523 |
| 8,055,459 | B2* | 11/2011 | Montanari | G01R 31/1227 324/538 |
| 8,098,072 | B2* | 1/2012 | Twerdochlib | G01R 31/1272 324/536 |
| 8,447,540 | B2* | 5/2013 | Montanari | G01R 31/1272 702/58 |
| 8,901,941 | B2* | 12/2014 | Serra | G01R 31/1227 324/649 |
| 8,990,035 | B2* | 3/2015 | Serra | G01R 31/1227 702/58 |
| 9,037,438 | B2* | 5/2015 | Cavallini | G01R 31/12 702/189 |
| 2004/0246000 | A1* | 12/2004 | Kuppuswamy | G01R 31/1254 324/536 |
| 2011/0012586 | A1* | 1/2011 | Montanari et al. | 324/76.77 |
| 2012/0095710 | A1* | 4/2012 | Bettio et al. | 702/65 |

FOREIGN PATENT DOCUMENTS

| | | | | |
|---|---|---|---|---|
| WO | 2007/144789 | A2 | 12/2007 | |
| WO | WO 2007/144789 | A2 * | 12/2007 | ............ G01R 31/12 |
| WO | 2009/013639 | A1 | 1/2009 | |

OTHER PUBLICATIONS

A. Cavallini et al.: A Novel Method to Locate PD in Polymeric Cable Systems Based on Amplitude-frequency (AF) Map, IEEE 2007_Jun. 11, 2007, PDF file attached.*

F. Puletti Et al Risk Management of HV Polymeric Cables Based on Partial Discharge Assesment Transmission and Distribution Conference and Exhibition, May 21-24, 2006, PDF file attachedt.*

Borghetto, J., et al., "Partial Discharge Inference by an Advanced System. Analysis of Online Measurements Performed on Hydrogenerator", IEEE Transactions on Energy Conversion, vol. 19, No. 2, Jun. 2004, pp. 333-339.

* cited by examiner

INSTRUMENT AND METHOD FOR DETECTING PARTIAL ELECTRIC DISCHARGES IN AN ELECTRIC APPARATUS

TECHNICAL FIELD

This invention relates to an instrument and a method for detecting partial electric discharges in an electric apparatus.

BACKGROUND ART

This invention relates to the technical field of diagnosing electrical systems (particularly high-voltage systems) by detecting and then processing partial electrical discharges.

It should be noted that a partial discharge is an electric discharge limited to a portion of the insulation of an electrical system and does not therefore cause immediate failure of the system but its gradual degradation. By their very nature, therefore, partial discharges are substantially limited in extent to a defect in the insulating system.

In light of this, diagnostic methods based on the detection and interpretation of partial discharges are among the most promising and widely studied in the context of scientific research since the study of partial discharges makes it possible to investigate the nature of defects in the insulating system where the discharges occur.

The detection and subsequent processing of partial discharges for diagnostic purposes, however, has not yet become a standard industrial tool for planning the maintenance and/or substitution of high-voltage electrical components on account of the difficulties encountered in interpreting the results of measurements.

As regards the detection of partial discharges, several methods have been developed, based on the use of different physical phenomena associated with discharges, such as, for example, methods of optical, acoustic and electrical type.

This invention relates in particular but not exclusively to detection methods of the electrical type which, as is known, involve measuring the current pulses that travel a detection circuit coupled to the electrical system being checked.

These detected current pulses (hereinafter referred to, for convenience, as discharge pulses) have a time profile that depends on the dynamics of the partial discharges (that is, on the physics of the discharge phenomena) and on the nature of the means which the detected pulses cross as they travel from the discharge site (where the discharges occur) to the detection site.

The time profile of the discharge pulses, consisting of the waveform of the pulses themselves, contains precious diagnostic information regarding both the physical phenomena associated with the discharges (correlated with the nature of the defects of the insulating system) and the nature of the medium which the detected pulses travel through (correlated with the location of the defects in the insulating system).

When measuring partial discharges, it is important to assign to each signal detected a value of a phase parameter representative of the phase of the voltage applied to the electric apparatus at the time of detecting the signal (for example using a sync probe positioned along the electric apparatus).

It should be noted that by assigning such a value it is assumed that the electric apparatus is subjected to alternating current (AC) voltage. In effect, according to a known technique, the phase angle of the voltage at the time a signal is detected is measured and that angle is assigned to the signal itself.

The phase parameter is commonly used in combination with an amplitude parameter (correlated with the intensity of the discharge pulses detected) in order to interpret the partial discharge measurement data for diagnostic purposes.

In effect, it is known that the discharge pulses lying in a plane having as its coordinates the amplitude and phase parameters form a pattern (also known as PRPD pattern, or Phase Resolved Partial Discharge pattern) which well represents the nature of the discharge site, that is, of the defect where the partial discharges occur.

As to the difficulties of interpreting the results of partial discharge measurements, these depend not only on the need to have experience and a specific case history but also on the fact that the measured data may be unreliable or insignificant.

In light of this, the problems that invalidate diagnostics based on the measurement of partial discharges are essentially of two kinds:

during detection of the signals associated with the partial discharges, information essential for subsequent processing of the signals themselves for diagnostic purposes may be lost (loss of information might consist, for example, of failure to detect a pulse, or assigning to a certain partial discharge activity a signal from another source or relating to a different discharge activity);

during such detection, noise may be superposed on the discharge signals or the signals from different sources may be superposed on each other, thus making it objectively difficult to interpret the results since it is impossible to perform significant statistical processes on data which is not uniform and/or not pertinent to the individual partial discharges to be processed.

As regards the loss of information during detection, it should be noted that signals associated with partial discharges are electric pulses having a very high frequency content (with leading edges in the order of nanoseconds or dozens of nanoseconds) and, in some cases, have a relatively high repetition frequency (for example hundreds or thousands of pulses per second).

Thus, with regard to the instrument used to detect the signals associated with the partial discharges, the problem is that of capturing very rapidly and efficiently electrical signals having a high frequency content, while maintaining the information content of the signals as much as possible. Furthermore, the instrument should allow the significant diagnostic signals to be effectively separated from noise or other "unwanted" signals.

The solution to the above mentioned problems is particularly difficult if we consider the need to detect the partial discharges and to process the state of the electric system in unattended manner or with the minimum of operator intervention (in some cases, such as online monitoring systems, there is no operator at all).

In practice, if unwanted signals (for example, signals associated with noise or discharge activities outside the measuring instrument) are superposed on the partial discharge activities to be detected, there is the risk that many of the discharge signals to be detected will remain undetected by the instrument, especially if the repetition rate of the unwanted signals is very high.

In the context of partial discharge detection instruments currently in use, known in the prior art (from document WO2007/144789 in the name of the same Applicant as this invention) is the employment of dedicated hardware configured to detect the discharge signals and to extract the pertinent parameters from them in real time.

In particular, that instrument comprises:

an input stage set up to receive a discharge signal representative of one or more partial discharge pulses and a sync signal representative of an alternating voltage applied to the electric apparatus;

an output stage set up to transfer data in digital form to the output from the instrument;

a data processing stage connected both to the input stage and to the output stage for receiving the discharge signal and the sync signal, and extracting substantially in real time for each pulse detected the value of an amplitude parameter correlated with a pulse amplitude, and the value of a phase parameter representative of the phase of the voltage applied to the electric apparatus concurrently with the pulse, and transferring to the output stage a processed digital signal comprising the values extracted.

This instrument therefore increases detection speed considerably.

It does not, however, fully solve the above mentioned problems.

In effect, unwanted signals with particularly high repetition rates are sometimes superposed on the discharge activities to be monitored. Indeed, in some cases, the unwanted signals have a waveform that is similar to (or at least easily-mistaken for) that of the signals to be detected.

Document WO2007/144789 also describes a conditioning element designed to digitally filter the processed signal as a function of the derived values.

The conditioning element filters the measured signal according to predetermined parameters (correlated with diagnostic processes on the electrical system based on the processing of the partial discharge activity).

More specifically, WO2007/144789 describes how the conditioning element advantageously makes it possible to reject noise or select pulses belonging to a given discharge phenomenon with respect to other superposed pulses, in real time, on the basis of the waveform of the signals.

Document WO2007/144789, however, provides no further indication on how the conditioning element is made and works.

More specifically, WO2007/144789 does not provide any teachings or suggestions on possible filtering strategies, but very simply and generically refers to a possibility of selecting some pulses and rejecting others based on the waveform of the signals detected.

Furthermore, during the monitoring of a partial discharge activity, it is often necessary to focus on the signals relating to a predetermined discharge activity (correlated with a corresponding defect in the insulating system being checked) ignoring all other signals.

This problem is neither tackled nor solved by WO2007/144789.

Document WO2009/013639, in the name of the same Applicant as this invention, regards a method for detecting, identifying and locating partial discharges occurring at a discharge site along an electric apparatus such as, for example, a cable.

According to that document, the signals are separated as a function of detected parameters. Separation does not, however, take place in real time, when the signals themselves are detected, but during a subsequent step of processing data which has been stored.

Hence, the method of document WO2009/013639 does not allow real time filtering but aims to identify a strategy for locating the discharge sources based on the processing of data groups acquired on different sections of the electric apparatus being checked.

Further, document EP1094323 discloses a method and a system for identifying the source of a partial discharge activity by processing previously stored data, in particular using mathematical algorithms based on fuzzy logic.

That document does not regard either real-time detection or real-time filtering of the signals.

Thus, even document EP1094323 does not tackle the above mentioned problems.

AIM OF THE INVENTION

This invention has for an aim to provide an instrument and a method for detecting partial electric discharges in an electric apparatus and which overcome the above mentioned disadvantages of the prior art.

More specifically, this invention has for an aim to provide an instrument and a method for detecting partial electric discharges capable of detecting the signals to be measured in a particularly efficient manner, even in the presence of simultaneous and particularly frequent unwanted signals.

Another aim of the invention is to provide an instrument and a method for detecting partial electric discharges which can optimize the calculation resources for detecting and processing the signals to be measured and dedicating a minimum amount of resources to the unwanted signals.

Another aim of the invention is to provide an instrument and a method for detecting partial electric discharges which are particularly simple and convenient to use even for non-specialist personnel.

Another aim of the invention is to provide an instrument and a method for detecting partial electric discharges which make it possible to focus on the signals relating to one or more predetermined discharge activities (correlated with corresponding defects in the insulating system being checked) preventing detection of all other signals, for example during the monitoring of partial discharges that occur in an electric apparatus.

The above aims are fully achieved by the instrument according to this invention as characterized in the appended claims and which is characterized, in particular, in that the processing stage comprises a filtering module designed to enable or disable, substantially in real time, the transfer to output of the parameter values extracted for one or more pulses, as a function of comparing the extracted values for the amplitude and phase parameters with predetermined reference values for the same amplitude and phase parameters.

The method according to this invention comprises the following steps:

receiving at an input stage a discharge signal representative of one or more partial discharge pulses and a sync signal representative of an alternating voltage applied to the electric apparatus;

processing the discharge signal and the sync signal substantially in real time, that is to say, without the need to archive data in a memory, in order to extract in real time for each pulse detected the value of an amplitude parameter, correlated with a pulse amplitude, and the value of a phase parameter, representative of the phase of the voltage applied to the electric apparatus concurrently with the pulse;

transferring to output a processed digital signal comprising the values extracted.

This method is characterized in that the processing step comprises the following steps:

comparing the values extracted for the amplitude and phase parameters with the predetermined reference values for the amplitude and phase parameters;

enabling or disabling substantially in real time the transfer to output of the values of the parameters extracted for the pulses as a function of the comparison.

BRIEF DESCRIPTION OF THE DRAWINGS

These and other features of the invention will become more apparent from the following description of a preferred, non-limiting embodiment of it, with reference to the accompanying drawings, in which.

DETAILED DESCRIPTION OF THE PREFERRED EMBODIMENTS OF THE INVENTION

The numeral 1 in the accompanying drawings denotes an instrument for detecting partial electric discharges in an electric apparatus.

The electric apparatus is any electric apparatus comprising an insulating system to be diagnosed by measuring and analysing partial discharge activities taking place within the insulating system itself.

More specifically, during measurement of the partial discharges, it is assumed that the electrical apparatus (or rather, the insulating system of the electrical apparatus) is subjected to alternating current voltage (50 Hz in the example illustrated).

The fact that the electrical apparatus is subjected to alternating current voltage (typically sinusoidal) makes it possible to assign to each signal detected the value of a phase parameter given by the phase of the voltage applied to the electrical apparatus at the instant the signal is detected and hence representative of the value of the voltage applied to the electrical apparatus at the instant the signal is detected.

Figure 1:
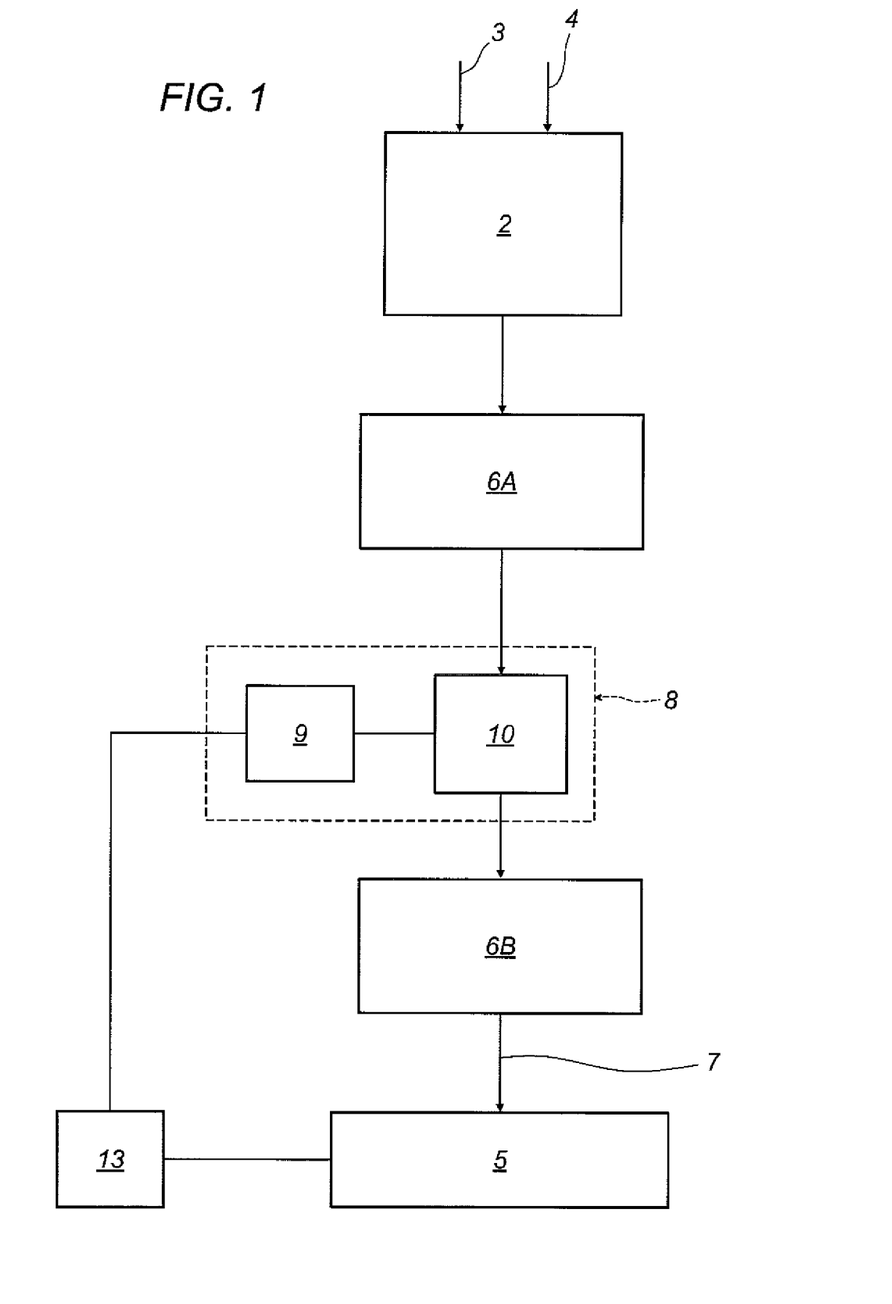
FIG. 1 is a functional diagram of the instrument according to the invention.

In light of this, the instrument 1 comprises an input stage 2 set up to receive a discharge signal 3 representative of one or more partial discharge pulses and a sync signal 4 representative of an alternating voltage applied to the electric apparatus.

For example, the sync signal 4 is picked up by a capacitive divider or other known system.

The instrument 1 also has an output stage 5 set up to make available, that is output, data in digital form from the instrument 1.

The instrument 1 further comprises a data processing stage 6 connected both to the input stage 2 and to the output stage 5 for receiving the discharge signal 3 and the sync signal 4.

The processing stage 6 is designed to generate a digital representation of the (analogue) discharge signal 3 received as input.

Preferably, the input stage is designed to generate a digital representation of the full waveform of the pulses, in order to output a digitized discharge signal representative of the full waveform of the pulses contained in the discharge signal 3.

It should be noted that the discharge signal 3 is picked up by the instrument 1 through a sensor according to a per se known method.

The processing stage 6 is configured to extract the value of predetermined parameters substantially in real time for each pulse detected and to transfer to the output stage 5 a processed digital signal 7 comprising the values extracted for those parameters.

More specifically, the processing module 6 is configured to extract (substantially in real time) for each pulse detected, the values at least of the following parameters:

an amplitude parameter q, correlated with an amplitude of the pulse;

a phase parameter f, representative of the phase of the voltage applied to the electrical apparatus concurrently with the pulse.

The amplitude of the pulse is correlated, for example, with the peak intensity of the pulse or with the effective value of the same, and is normally measured in V or pC.

The pulse phase is measured in degrees and varies between 0 and 360.

Preferably, the processing stage 6 is designed to extract other parameters, in addition to the amplitude parameter q and the phase parameter f.

More specifically, the processing stage 6 is designed to receive the digitized discharge signal and, for each pulse detected, to extract substantially in real time the value of at least one shape parameter correlated with the waveform of the pulse.

More preferably, the processing stage 6 is designed to extract (substantially in real time), for each detected pulse of the digital discharge signal, the value of a first shape parameter W, correlated with the frequency content of the pulse, and of a second shape parameter T, correlated with the duration of the pulse.

It should be noted that, for deriving the above mentioned shape parameters, the processing stage 6 is preferably programmed to operate as follows:

the first shape parameter W is derived as standard deviation of the partial discharge pulse processed in the frequency domain;

the second shape parameter T is derived as standard deviation of the partial discharge pulse processed in the time domain.

Preferably, the processing stage 6 is designed to also extract the following parameters:

detection instants (for each pulse detected), referenced both to an absolute reference (for example a GPS synchronization system) and to a reference instant for the start of an acquisition (by acquisition is meant detection of a plurality of pulses protracted for a predetermined time, or detection of a predetermined number of pulses);

repetition rate of the pulses detected per unit of time.

Thus, the processed digital signal 7 preferably comprises the values extracted for these parameters.

The extraction of the parameters occurs substantially in real time, that is to say, without the need for an intermediate data storage memory.

More specifically, as regards the expressions "in real time" and "storage memory" attention is drawn to the following.

The expression "processing of a data item in real time" is used to mean that, within a data flow (for example from an input to an output), that data item is processed substantially without the process involving an interruption in the data flow. For example, the fact of placing the data item in a memory (potentially for an indefinite length of time) for subsequent retrieval and processing at any later time constitutes an interruption in the data flow and, hence, data storage. By "storage memory" is precisely meant a memory designed to (that is to say, a memory controlled, in terms of hardware, in such a way as to) contain a data item for a potentially indefinite time for subsequent retrieval (at any time) and processing. In light of this, it should be noted that a mass storage memory, such as the hard disk of a computer, for example, is typically a storage memory, while a RAM may, depending on how it is controlled, constitute a storage memory (as defined above) or, alternatively, a buffer (temporary memory), that is, a means of slowing down the data flow (at a certain point along the path followed by the data from input to output) but without interrupting it. Thus, by "processing in real time" is meant that processing occurs during the passage of the data from an input to an output in a substantially continuous flow, where the data flow can be slowed down by temporarily accumulating the data in a substantially volatile memory.

According to the invention, the processing stage 6 comprises a filtering module 8 designed to disable, substantially in real time, the transfer to output (that is, to the output stage 5) of the data relating to (that is of the parameter values extracted for) one or more pulses, as a function of comparing the extracted values for the amplitude parameter q and the phase parameter f with predetermined reference values for said amplitude and phase parameters.

Preferably, the filtering module 8 is designed to disable substantially in real time the transfer to output of the values of the parameters extracted for all the pulses whose extracted amplitude and phase parameter values lie in a reference plane (q-f) having as its coordinates the phase and amplitude parameters inside or outside a filtering area defined by the reference values of the phase and amplitude parameters.

It should be noted that the expression "inside or outside a filtering area" is used to mean inside or, alternatively, outside that filtering area.

That way, the processed digital signal 7 made available at the output of the instrument 1 is free of data corresponding to the unwanted pulses, as a function of a filtering criterion based on the comparison between the values of certain parameters (in particular, amplitude q and phase f) for those pulses and the reference values of the parameters themselves.

It should be noted that the filtering module 8 comprises a chip which can be configured to define a filtering logic.

The filtering module is also equipped with interfacing means 9 through which the user of the instrument 1 can set or modify the control logic and/or the reference values of the parameters used for filtering.

For example, the filtering module 8 comprises an FPGA 10 (Field Programmable Gate Array) and a DSP connected to each other.

The FPGA 10 constitutes a memory containing the data relating to the filtering parameter reference values and the type of filtering logic. Further, the FPGA receives as input the digital signal containing the filtering parameter values and outputs the filtered signal, that is, the signal without the data relating to the pulses whose filtering parameter values do not satisfy the filtering criteria.

The DSP constitutes the interfacing means.

It should be noted that the filtering module 8 might also be made according to alternative embodiments. For example, an FPGA that also integrates the functions of the DSP might be used (in that case the DSP is not present). Alternatively to the FPGA, a dedicated chip, such as, for example, an ASIC (Application Specific Integrated Circuit), might be used.

More specifically, the reference values for the amplitude and phase parameters define at least one filtering area in the reference plane q-f having as its coordinates the phase and amplitude parameters.

In light of this, the filtering logic establishes whether disabling (that is, inhibition) of transfer to output of the extracted parameter values occurs for the pulses whose extracted amplitude and phase parameter values lie inside or outside the filtering area of the representation plane q-f.

In other words, depending on the filtering logic, the instrument 1 makes it possible to acquire (and hence make available at output) only the pulses which, in the representation plane q-f, lie inside or, alternatively, outside the filtering area defined by the predetermined reference values of the amplitude q and phase f parameters.

It should be noted that the processing stage 6 is designed to extract the parameters used for filtering to a first block 6A of the processing stage and the other parameters (not used in the filtering module 8) to a second block 6B of the processing stage, the filtering module 8 being interposed between the first and second blocks of the processing stage.

This advantageously makes it possible to perform highly complex calculations (for extracting the parameters that require such calculations) only on significant pulses, so as to avoid wasting resources and hence time processing data that will inevitably be overwritten, that is to say, whose transfer to output will inevitably be disabled (that is, inhibited).

It should also be noted that the second block 6B of the processing stage might not perform any calculation where all the significant parameters are extracted in the first block 6A of the processing module, that is, upstream of the filtering module 8.

As regards the method of defining the filtering area from the reference values of the filtering parameters, attention is drawn to the following.

The instrument 1 comprises at least one pair of reference values for the phase parameter and at least one pair of reference values for the amplitude parameter, defining at least one corresponding rectangular filtering area in the reference plane q-f having as its coordinates the phase and amplitude parameters. In practice, two pairs of reference values of the parameters q and f constitute two pairs of coordinates, for identifying two points in the reference plane q-f. These points define one of the diagonals of the rectangle.

The filtering module 8 is designed to disable substantially in real time the transfer to output of the data relating to (that is, the values of the parameters extracted for) all the pulses whose extracted amplitude and phase parameter values lie in the representation plane q-f inside (or outside) the filtering area.

According to the invention, the filtering module 8 may be provided with a plurality of reference values for the amplitude parameter q and a corresponding plurality of reference values for the phase parameter f, thus defining a plurality of filtering areas.

In that case, the filtering module 8 is configured to define a resultant filtering area that is the union of those filtering areas.

Operatively, the filtering module 8 is designed to disable substantially in real time the transfer to output of the data relating to (that is, the values of the parameters extracted for) all the pulses whose extracted amplitude and phase parameter values lie in the representation plane, inside, or alternatively, outside, all of those filtering areas.

According to another aspect of the invention, preferably, the filtering module 8 is designed to disable, substantially in real time, the transfer to output of the data relating to (that is of the parameter values extracted for) one or more pulses, as a function of comparing the extracted values for the shape parameter (or rather, at least one of the possible shape parameters correlated with the waveform of the pulses detected) with predetermined reference values for said shape parameter.

Preferably, the filtering module 8 is designed to disable substantially in real time the transfer to output of the data relating to (that is of the parameter values extracted for) all the pulses whose extracted values of the first and second shape parameters (W and T) lie in a reference plane W-T having as its coordinates said first and second shape parameters inside (or, alternatively, outside) a filtering area defined by predetermined reference values of the first and second shape parameters.

The above description regarding the preferred method of defining the filtering area through rectangles or a union of rectangles also applies to filtering as a function of the values of the shape parameters W and T.

Thus, the instrument 1 is designed to define two (or more) independent filtering criteria.

In the example described above, the first filtering criterion is based on the values of the parameters of amplitude q and phase f, and the second filtering criterion is based on the values of the first shape parameter W and of the second shape parameter T.

The reference values of each pair of filtering parameters define corresponding filtering areas in the respective reference planes (more specifically, a first filtering area in the plane q-f and a second filtering area in the plane W-T).

In light of this, it should be noted that the filtering logic defined by the filtering module 8 (and settable by the user of the instrument 1 through the interfacing means 9) can be configured in such a way that transmission of the data corresponding to a pulse is disabled when both the filtering criteria are met simultaneously or, alternatively, when at least one of the filtering criteria is met.

In light of this, it should be noted that the filtering module 8 is designed to disable substantially in real time the transfer to output of the data relating to (that is, the values of the parameters extracted for) all the pulses whose extracted amplitude and phase parameter values lie in the reference plane q-f inside (or outside) the corresponding filtering area (defined by the reference values of the phase and amplitude parameters) and/or whose extracted values of the first and second shape parameters lie in a reference plane W-T inside (or outside) the corresponding filtering area (defined by the reference values of the first and second shape parameters).

The combination of a filtering criterion based on the amplitude and phase parameters and a filtering criterion based on the shape parameters is particularly effective because it synergically combines the effects of both filtering criteria.

In effect, the filtering criterion based on the amplitude and phase parameters is very important because the pulses relating to a partial discharge activity tend to be positioned in certain zones of the reference plane q-f. Similarly, the pulses due to certain disturbances (for example, the disturbances correlated with the voltage applied to the electrical apparatus being measured) are positioned in zones of the plane q-f different from those of the pulses relating to the partial discharges and thus able to be recognized and isolated. It is therefore important to be able to exclude certain zones of the plane q-f from acquisition.

The filtering criterion based on the shape parameters is also useful because it has been found that pulses relating to different sources tend to have different waveforms and hence to be positioned in separate zones of the reference plane W-T. Therefore, pulses due to certain disturbances (for example, background noise) are positioned in zones of the plane W-T different from those of the partial discharge pulses and can thus be recognized and isolated. It should be noted, on the other hand, that at times these unwanted pulses (for example, due to background noise not correlated with the voltage applied to the electrical apparatus being measured) are laid (at least partly) over the pulses corresponding, in the plane q-f, to the partial discharges and are thus difficult to isolate in the plane q-f.

In short, as regards groups of pulses corresponding to concurrent phenomena (hence detected during the same acquisition having predetermined duration) that must be distinguished (in order to inhibit acquisition of one or more of these phenomena), certain groups may, depending on circumstances, be distinguishable in relation to certain parameters or combinations of parameters rather than others.

In the example illustrated (with reference to FIG. 2 in particular), the numeral 11 denotes rectangles defined in the plane q-f (showing the PRPD pattern of the partial discharge pulses). The resultant filtering area relating to the filtering criterion based on the amplitude and phase parameters is the union of the areas defined by the rectangles 11. In this example, the filtering logic is to disable transfer of the data that fall within the resultant filtering area.

Again in the example illustrated (with reference to FIG. 3 in particular), the numeral 12 denotes a rectangle defined in the T-W plane (showing the pattern of the partial discharge pulses). The filtering area relating to the filtering criterion based on the amplitude and phase parameters is the union of the areas defined by the rectangles 11. In this example, the filtering logic is to disable transfer of the data that fall within the resultant filtering area.

Figure 4:
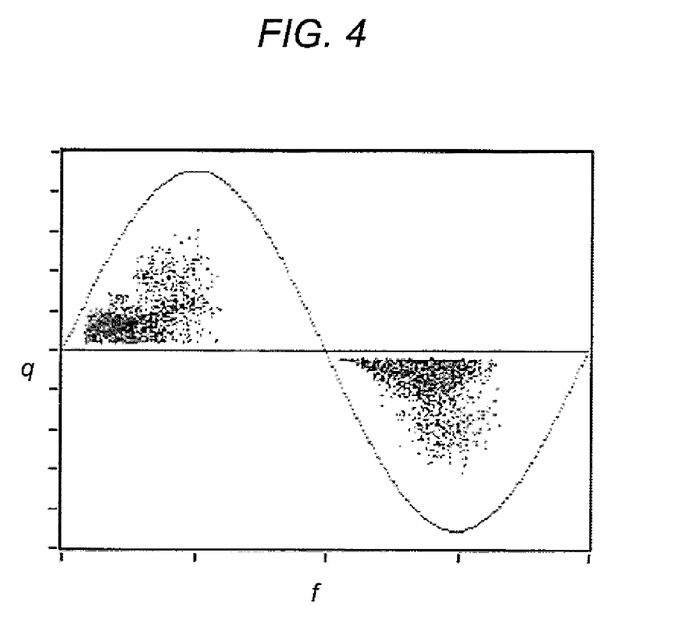
FIG. 4 shows the PRPD pattern of FIG. 2, with the instrument operating in the mode with the filters activated.
Figure 5:
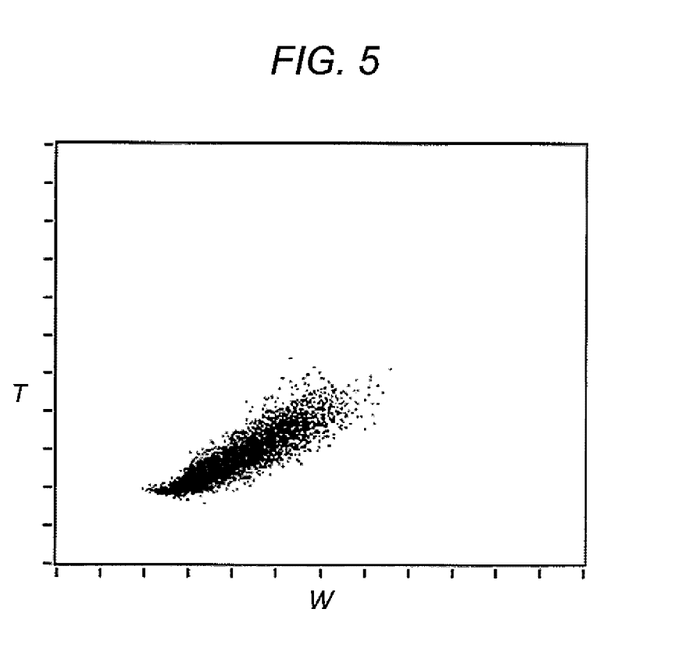
FIG. 5 shows the TW pattern displayed by the instrument of FIG. 1, corresponding to the pattern of FIG. 4.

FIGS. 4 and 5 show the data of the filtered digital signal 7 represented in the planes q-f and W-T, respectively.

It should be noted that, instead of rectangles, the areas might be defined in other ways—for example, the areas might be circular or ellipsoidal or based on any other suitable criterion.

According to another aspect of the invention, combinations of more than two parameters might be used.

In other words, hyperspaces might be defined which have any predetermined number of dimensions, equal to the number of filtering parameters to be used in combinations.

For example, a filtering criterion to be set might be based on a combination of the amplitude parameter q, the phase parameter f and one (or both) of the shape parameters W and T.

According to another aspect of the invention, combinations of pairs of parameters other than those described above might be used—for example the following combinations:
  amplitude parameter q-first shape parameter W;
  amplitude parameter q-second shape parameter T;
  phase parameter f-first shape parameter W;
  phase parameter f-second shape parameter T;

Preferably, therefore, the filtering module 8 is designed to disable substantially in real time the transfer to output of the data relating to (that is of the parameter values extracted for) all the pulses whose extracted values of the shape parameter and of the amplitude parameter or of the phase parameter lie in a reference plane having as its coordinates the shape parameter and the amplitude or phase parameter inside a filtering area defined by predetermined reference values of the shape parameter and of the amplitude or phase parameter.

It should be noted that the instrument 1 also preferably comprises a display 13 connected to the processing stage 6 (that is, to the output stage 5) for receiving the processed signal 7.

The display 13 (for example, comprising a screen connected to a processor, such as a PC) is designed to display a representation of the pulses represented in the processed digital signal 7 in a representation plane having as its coordinates the phase and amplitude parameters.

Figure 2:
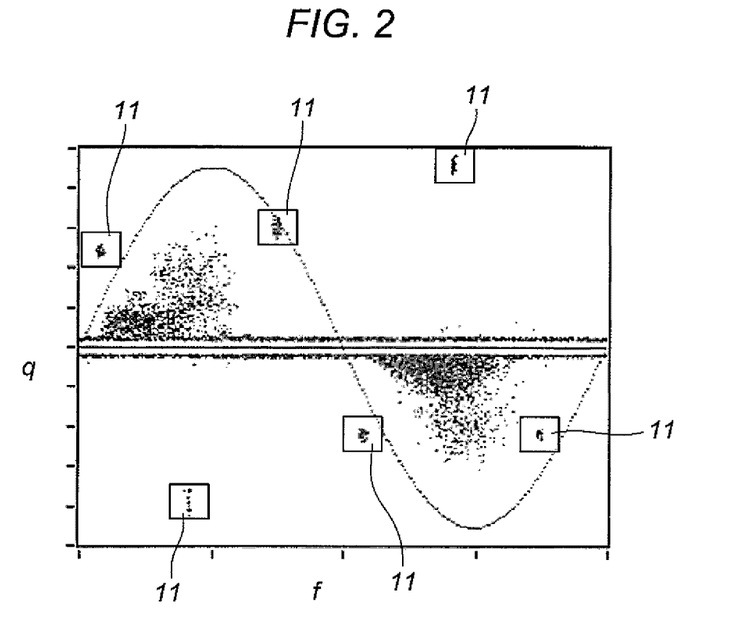
FIG. 2 shows a PRPD pattern displayed by the instrument of FIG. 1.

More specifically, the display 13 is configured to represent the pulses as points in the reference plane q-f (as illustrated for example in FIGS. 2 and 4).

The display 13 is also designed to display a representation of the pulses represented in the processed digital signal 7 in a representation plane T-W having as its coordinates the first and second shape parameters.

Figure 3:
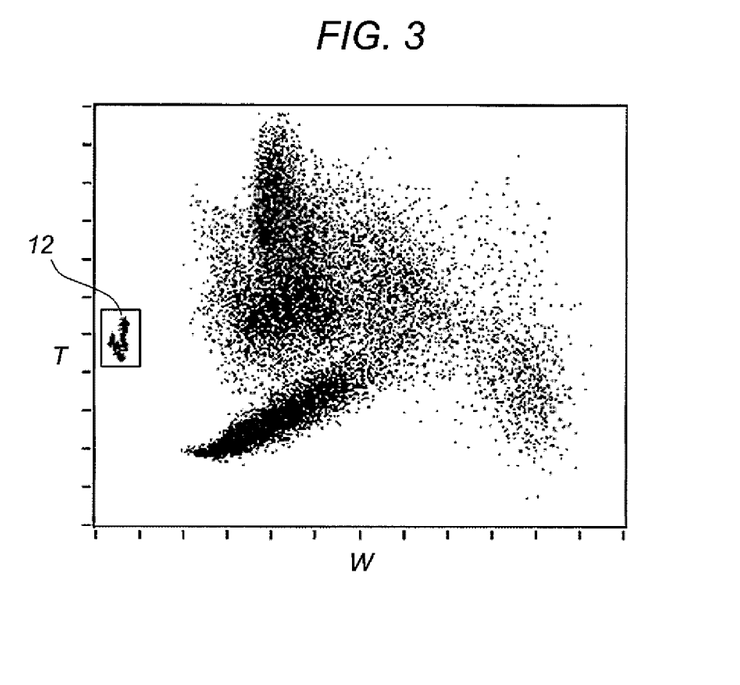
FIG. 3 shows the TW pattern displayed by the instrument of FIG. 1, corresponding to the pattern of FIG. 2.

More specifically, the display 13 is configured to represent the pulses as points in the reference plane W-T (as illustrated for example in FIGS. 3 and 5).

The display 13 is also designed to represent the pulses of the processed digital signal 7 in any representation plane, defined by two or three parameters selectable by the user of the instrument 2.

In light of this, it should noted that the display 13 is connected to the interfacing means 9 to allow the user of the instrument 1 to select at his/her discretion the parameters for displaying the pulses and to set corresponding reference values and filtering logics related to those parameters.

Further, the interfacing means 9 are configured to constitute a selector connected to the display 13 to allow the user of the instrument 1 to select (that is, to define) at least one region of the representation plane (or rather, of at least one of the representation planes or spaces), so as to transfer to the processing unit corresponding values of the filtering parameters describing the selected space region. These values constitute the reference values for the filtering module 8 and the selected space region constitutes the filtering area.

This advantageously allows the user of the instrument 1 to display the discharge patterns (for example the PRPD pattern in the plane q-f or the pattern in the plane T-W) and to very easily select the filtering areas (for example by drawing rectangles with a mouse) and set the filtering criteria.

That way, the effects of filtering are displayed by the display 13 in real time on all the representations (in the example described, on the representation in the plane q-f and in the plane W-T).

Advantageously, that means the effects of filtering can be viewed in real time and the set filtering criteria improved or removed.

This invention also provides a method for detecting partial electric discharges in an electrical apparatus.

The method comprises the following steps:
receiving at the input stage 2 a discharge signal 3 representative of one or more partial discharge pulses and the sync signal 4 representative of the alternating voltage applied to the electric apparatus being measured;
processing the discharge signal 3 and the sync signal 4 substantially in real time, that is to say, without the need to archive data in a memory, in order to extract in real time for each pulse detected at least the value of the amplitude parameter q (correlated with the pulse amplitude), and the value of the phase parameter f (representative of the phase of the voltage applied to the electric apparatus concurrently with the pulse);
transferring to output a processed digital signal 7 comprising the values extracted.

According to the invention, the processing step comprises the following steps:
comparing the values extracted for the amplitude and phase parameters with the predetermined reference values for the amplitude and phase parameters;
disabling substantially in real time the transfer to output of the data relating to (that is of the parameter values extracted for) one or more of the pulses as a function of the comparison.

Preferably, the comparison involves checking whether or not the extracted amplitude and phase parameter q, f values (lying in the reference plane q-f having as its coordinates the phase and amplitude parameters) are inside a filtering area defined by the reference values of the phase and amplitude parameters.

Preferably, the method comprises:
a step of generating at the input stage 2 a digital representation of the full waveform of the one or more pulses, in order to output a digitized discharge signal;
a step of extracting substantially in real time, for each pulse detected, the value of at least one shape parameter, correlated with the pulse waveform;
comparing the values extracted for the shape parameter with the predetermined reference values for the shape parameter.

The step of disabling substantially in real time the transfer to output of the values of the parameters extracted for the pulses is performed also as a function of the comparison (which constitutes a further filtering criterion based on the at least one shape parameter).

The method preferably further comprises:
a step of extracting substantially in real time for each detected pulse the value of the first shape parameter W (correlated with the frequency content of the pulse) and of the second shape parameter T (correlated with the duration of the pulse);
a first step of comparing the values extracted for the amplitude and phase parameters with the predetermined reference values for the amplitude and phase parameters, by checking whether or not the amplitude and phase parameter values extracted lying in the reference plane q-f (having as its coordinates the amplitude and phase parameters) are inside a filtering area defined by the amplitude and phase parameter reference values;
a second step of comparing the values extracted for the first and second shape parameters with the predetermined reference values for the first and second shape parameters, by checking whether or not the first and second shape parameter values extracted lying in the reference plane W-T (having as coordinates the first and second shape parameters) are inside a filtering area defined by the first and second shape parameter reference values.

That allows two filtering criteria to be defined in parallel.

In that case, the step of disabling substantially in real time the transfer to output of the values of the data relating to (that is of the parameter values extracted for) the pulses is performed as a function of the occurrence of a condition based on the first comparing step and/or a condition based on the second comparing step.

In effect, according to the above description of the instrument 1, the two filtering criteria (the one associated with the amplitude and phase parameters and the one associated with the shape parameters) can be combined by an "AND" or an "OR" logical operator.

In other terms, the filtering criteria can be combined in such a way that the outputting of a pulse is disabled (inhibited) if it lies in the filtering area associated with the amplitude and phase parameters and at the same in the filtering area of the shape parameters a pulse (filtering criteria connected by "AND" operator).

Alternatively, the filtering criteria can be combined in such a way that the outputting of a pulse is disabled (inhibited) if at least one of the following conditions is true:
the pulse lies in the filtering area associated with the amplitude and phase parameters;

the pulse lies in the filtering area associated with the shape parameters.

That corresponds to the condition where the filtering criteria are connected by the "OR" operator.

As regards the mode of defining the filtering area, what is described above in connection with the instrument 1 applies.

Preferably, the area is defined by indicating one or more rectangles directly on the display 13. Each rectangle is used to define a portion of the representation plane of the pulses detected (that is, the plane q-f, W-T or any other plane defined by any pair of extracted parameters).

Selecting a rectangle allows corresponding reference values for the respective parameters to be set (through the action of the interfacing means 9).

If more than one rectangle is selected in the same representation plane, the resultant filtering area is the union of the areas of all the rectangles.

This invention therefore offers the following advantages.

The invention provides the user (that is, the person who employs the instrument 1 or the method) with a mode of acquiring partial discharges that makes it possible to capture or reject pulses while they are actually being acquired on the basis of the amplitude and phase or other parameters associated with them.

In particular, the invention makes it possible to shape the areas in one or more reference planes (pulse representation planes) by means of superposable rectangles.

The total area (resultant) may be defined as the area where the pulses are rejected or the area where the pulses are captured (in the latter case, the rejection area is the one surrounding the selected resultant area) based on the set filtering logic.

Thus, the invention provides a very convenient and effective way of rejecting unwanted data at the acquisition stage and in real time (that is to say, before the data has been transferred to output or stored somewhere).

That way, space for storing the acquired data is saved and data transmission is greatly facilitated. Moreover, there is no need for complex techniques for rejecting unwanted data at a post-processing stage.

Further, thanks also to immediate visual feedback, the user has direct control over the data being detected and on the effect of the filters.

In light of this, it should be noted that the values of the amplitude and phase parameters, and possibly of the shape parameters, of all the pulses (including the rejected one) are in any case made accessible to the display 13 to allow the user to check what the result of acquisition would be in the absence of filtering.

The invention claimed is:

1. An instrument for detecting partial electric discharges in an electric apparatus, comprising:
    an input stage set up to receive a discharge signal representative of one or more partial discharge pulses and a sync signal representative of an alternating voltage applied to the electric apparatus;
    an output stage set up to transfer data from the instrument in digital form;
    a data processing stage connected both to the input stage and to the output stage, for receiving the discharge signal and the sync signal, and extracting substantially in real time for each pulse detected the value of an amplitude parameter, correlated with a pulse amplitude, and the value of a phase parameter, representative of the phase of the voltage applied to the electric apparatus concurrently with the pulse, and transferring substantially in real time to the output stage a processed digital signal comprising the values extracted,
    wherein the processing stage comprises a filtering module set up to disable substantially in real time the transfer to output of the values of the parameters extracted for one or more pulses, as a function of comparing the values extracted for the amplitude and phase parameters with predetermined reference values for the amplitude and phase parameters,
    wherein the filtering module is designed to disable substantially in real time the transfer to output of the values of the parameters extracted for all the pulses whose extracted amplitude and phase parameter values lie in a reference plane having as its coordinates the phase and amplitude parameters inside or outside a filtering area defined by the reference values of the phase and amplitude parameters,
    wherein the processing stage has a first block positioned upstream the filtering module and
    wherein the amplitude parameter and the phase parameter are extracted in real time in the first block of the processing stage, upstream the filtering module,
    wherein the instrument comprises an interface for interacting with a user and a display for displaying a pattern representative of a plurality of acquired pulses positioned in said reference plane shown on the display, and wherein the processing stage is configured for setting said filtering area in response to a portion of said reference plane drawn by the user directly on the display through the interface.

2. The instrument according to claim 1, wherein
    the input stage is designed to generate a digital representation of the full waveform of the one or more pulses, in order to output a digitized discharge signal;
    the processing module is designed to receive the digitized discharge signal and, for each pulse detected, to extract substantially in real time the value of at least one shape parameter correlated with the waveform of the pulse;
    the filtering module is set up to disable substantially in real time the transfer to output of the values of the parameters extracted for one or more pulses, as a function of a comparing the values extracted for the shape parameter with predetermined reference values for that shape parameter.

3. The instrument according to claim 2, wherein:
    the processing module is designed to extract substantially in real time, for each detected pulse of the digital discharge signal, the value of a first shape parameter, correlated with the frequency content of the pulse, and of a second shape parameter, correlated with the duration of the pulse;
    the filtering module is designed to disable substantially in real time the transfer to output of the parameter values extracted for all the pulses whose extracted values of the first and second shape parameters lie in a reference plane having as its coordinates the first and second shape parameters inside or outside a filtering area defined by predetermined reference values of the first and second shape parameters.

4. The instrument according to claim 2, wherein the filtering module is designed to disable substantially in real time the transfer to output of the parameter values extracted for all the pulses whose extracted values of the shape parameter and of the amplitude parameter or phase parameter lie in a reference plane having as its coordinates the shape parameter and the amplitude or phase parameter inside or outside a filtering area defined by predetermined reference values of the shape parameter and of the amplitude or phase parameter.

5. The instrument according to claim 3, wherein the filtering module is designed to disable substantially in real time the transfer to output of the parameters values extracted for all of the pulses for which at least one of the following conditions is verified:

extracted values of the amplitude and phase parameters lie in a reference plane having as its coordinates the phase and amplitude parameters, inside or outside a filtering area defined by the reference values of the amplitude and phase parameters;

extracted values of the first and second shape parameters lie in a reference plane having as its coordinates the first and second shape parameters, inside or outside a filtering area defined by the reference values of the first and second shape parameters.

6. The instrument according to claim 1, comprising:

a display designed to receive the processed signal and to display a representation of the related pulses in a representation plane having as its coordinates the phase and amplitude parameters;

a selector connected to the display, allowing a user to select at least one region of the representation plane, thereby setting in the filtering module the values of the phase and amplitude parameters designed to describe said region of space, the values constituting reference values for the filtering module.

7. A method for detecting partial electric discharges in an electric apparatus, comprising the following steps:

receiving at an input stage a discharge signal representative of one or more partial discharge pulses and a sync signal representative of an alternating voltage applied to the electric apparatus;

processing the discharge signal and the sync signal substantially in real time, in order to extract in real time for each pulse detected the value of an amplitude parameter, correlated with a pulse amplitude, and the value of a phase parameter, representative of the phase of the voltage applied to the electric apparatus concurrently with the pulse;

transferring, substantially in real time, to output a processed digital signal comprising the values extracted;

wherein the processing step comprises the following steps:

comparing the values extracted for the amplitude and phase parameters with the predetermined reference values for the amplitude and phase parameters;

disabling substantially in real time the transfer to output of the extracted parameters values for the pulses as a function of the comparison, where the comparison involves checking whether or not the extracted amplitude and phase parameter values lying in a reference plane having as its coordinates the phase and amplitude parameters are inside a filtering area defined by the reference values of the phase and amplitude parameters, wherein the amplitude parameter and the phase parameter are extracted in real time prior to the step of comparing and disabling, whereby the steps of comparing and disabling are carried out subsequently with respect to the extraction of the amplitude parameter and the phase parameter, wherein the method further includes the following steps:

displaying on a display a pattern representative of a plurality of acquired pulses positioned in said reference plane;

setting said filtering area based on a portion of said reference plane shown on the display, said portion being drawn by the user on the display through an interface.

8. The method according to claim 7, comprising:

a step of generating at the input stage a digital representation of the full waveform of the one or more pulses, in order to output from the input stage a digitized discharge signal;

a step of extracting substantially in real time, for each pulse detected, the value of at least one shape parameter, correlated with the pulse waveform;

comparing the values extracted for the shape parameter with the predetermined reference values for the shape parameter, the step of disabling substantially in real time the transfer to output of the values of the parameters extracted for the pulses being performed also as a function of the comparison.

9. The method according to claim 8, comprising:

a step of extracting substantially in real time for each detected pulse the value of a first shape parameter correlated with the frequency content of the pulse, and of a second shape parameter correlated with the duration of the pulse;

a first step of comparing the values extracted for the amplitude and phase parameters with the predetermined reference values for the amplitude and phase parameters, by checking whether or not the amplitude and phase parameter values extracted lying in a reference plane having as its coordinates the amplitude and phase parameters are inside a filtering area defined by the amplitude and phase parameter reference values;

a second step of comparing the values extracted for the first and second shape parameters with the predetermined reference values for the first and second shape parameters, by checking whether or not the first and second shape parameter values extracted lying in a reference plane having as coordinates the first and second shape parameters are inside a filtering area defined by the first and second shape parameter reference values, the step of disabling substantially in real time the transfer to output of the values of the parameters extracted for the pulses being performed as a function of the occurrence of a condition based on the first comparing step and/or a condition based on the second comparing step.

10. The method according to claim 7, comprising the following steps:

displaying on a display a representation of the pulses relating to the processed signal in a representation plane having as its coordinates the phase and amplitude parameters;

displaying on the display a selector to allow user to select at least one region of the representation plane, thereby setting in the filtering module the values of the phase and amplitude parameters designed to describe said region of space, the values constituting reference values for the filtering module.

\* \* \* \* \*